(12) United States Patent
Chong, Jr. et al.

(10) Patent No.: US 6,881,078 B1
(45) Date of Patent: Apr. 19, 2005

(54) INTERCONNECTING DEVICE THAT ALLOWS FOR CONNECTIONS IN SMALL SPACE

(75) Inventors: Fay Chong, Jr., Cupertino, CA (US); William L. Grouell, San Ramon, CA (US)

(73) Assignee: Sun Microsystems, Inc., Santa Clara, CA (US)

( * ) Notice: Subject to any disclaimer, the term of this patent is extended or adjusted under 35 U.S.C. 154(b) by 0 days.

(21) Appl. No.: 10/325,060

(22) Filed: Dec. 19, 2002

(51) Int. Cl.[7] .................. H01R 12/00; H01R 9/00; H05K 1/00; G06F 11/00
(52) U.S. Cl. .................. 439/78; 361/775; 714/138
(58) Field of Search .................. 439/78, 61, 65; 361/775; 714/138

(56) References Cited

U.S. PATENT DOCUMENTS

| | | | | |
|---|---|---|---|---|
| 4,476,357 A | * | 10/1984 | Malmborg et al. | 200/51.09 |
| 4,981,439 A | * | 1/1991 | Piedmont | 439/135 |
| 5,220,815 A | * | 6/1993 | Davidge et al. | 70/14 |
| 5,325,267 A | * | 6/1994 | Ewing | 361/760 |
| 6,070,251 A | | 5/2000 | Chong, Jr. | |
| 6,098,155 A | | 8/2000 | Chong, Jr. | |
| 6,116,962 A | * | 9/2000 | Laity | 439/676 |
| 6,241,534 B1 | * | 6/2001 | Neer et al. | 439/76.1 |
| 6,328,572 B1 | * | 12/2001 | Higashida et al. | 439/61 |
| 6,333,860 B1 | * | 12/2001 | Oliphant et al. | 361/818 |
| 6,370,605 B1 | | 4/2002 | Chong, Jr. | |
| 6,497,592 B1 | * | 12/2002 | Beadle | 439/814 |
| 6,540,522 B1 | * | 4/2003 | Sipe | 439/61 |
| 6,548,756 B1 | * | 4/2003 | Jones et al. | 174/52.1 |
| 6,574,115 B1 | * | 6/2003 | Asano et al. | 361/775 |
| 6,690,845 B1 | * | 2/2004 | Yoshimura et al. | 385/14 |

* cited by examiner

*Primary Examiner*—Chandrika Prasad
(74) *Attorney, Agent, or Firm*—Blakely, Sokoloff, Taylor & Zafman (57) ABSTRACT

An adapter for an interconnecting device. The adapter comprises a backboard having a first end and a second end. A connector having first conductive elements is coupled to the first end. A receptacle having second conductive elements is coupled to the second end. A plurality of conductive lines is coupled to the backboard. The plurality of conductive lines electrically connects the first conductive elements to the second conductive elements.

28 Claims, 9 Drawing Sheets

INTERCONNECTING DEVICE THAT ALLOWS FOR CONNECTIONS IN SMALL SPACE

FIELD

The present inventions relates to physically restricting access to an interconnecting device such as a switch or a hub interconnected to a data processing system such as a data storage system or a data storage network and to making connections to the interconnecting device in a small space.

BACKGROUND

An interconnecting device such as a router, a switch, or a hub is widely used in many data processing systems. For example, in data communication system, a router, a switch, or a hub is used as a communication channel(s) for the exchanges or transfers of data. A router, a switch, or a hub allows for communication within a storage network, a data exchange network, an Internet system, and other data processing systems involving in transferring of data from one location to another location. A router, a switch, or a hub does this by linking or interconnecting one or multiple host data processing systems (or workstations) to one or multiple data storage sources or servers. A router, a switch, or a hub also creates an intelligent connection framework leading to efficient accesses and transfers of stored data.

Figure 1:
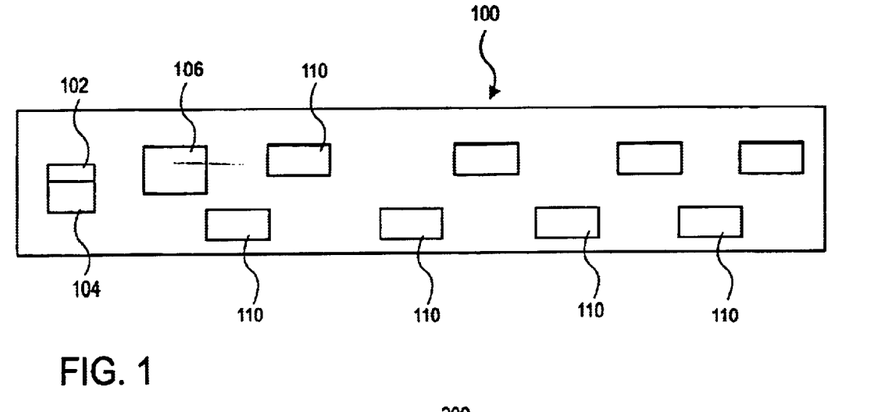
FIG. 1 illustrates an exemplary switch as an example of an interconnecting device.

FIG. 1 illustrates an example of a switch 100 which may be used in a storage network. The switch 100 can be a Fibre Channel (FC) switch in one example. Typically, the switch 100 includes an on/off switch 102, a power connection 104, an Ethernet port 106, and a plurality of switch ports 110. In one example, the switch ports 110 are GBIC (Gigabit Interface Converter) ports. The on/off switch 102 turns the switch 100 on or off. The power connection 104 allows power to be supplied to the switch 100. The Ethernet port 106 allows the switch 100 to interconnect to a service processor or another system for administration of the switch 100. The switch ports 110 allow for host data processing systems (not shown) and data storage systems/servers (not shown) to connect to the switch 100. The switch ports 110 may be hot-pluggable, auto discoverable, and/or capable of self-configuration.

Figure 2:
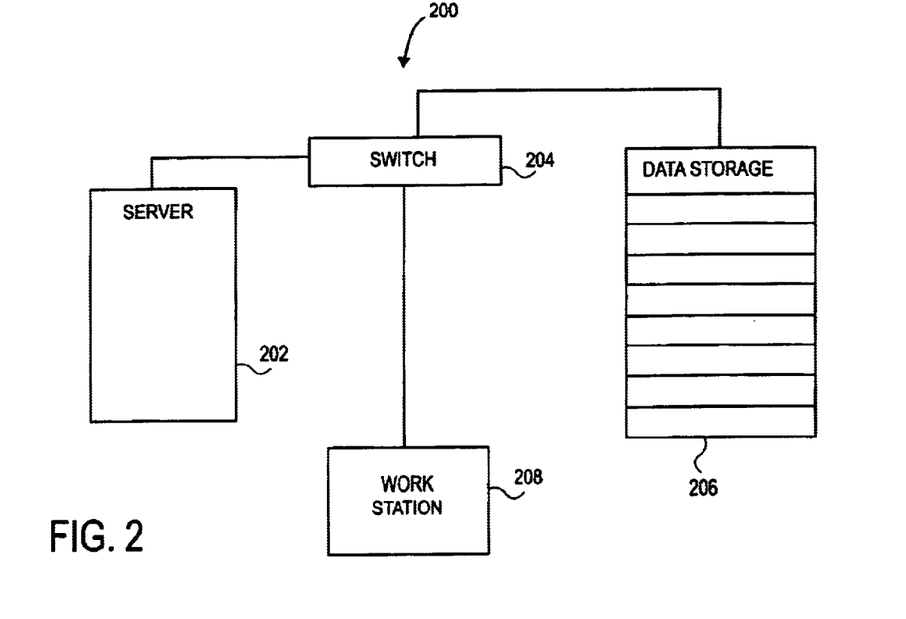
FIG. 2 illustrates a conventional data processing system that includes an interconnecting device such as a switch.

Interconnecting devices such as routers, switches or hubs are usually coupled to other devices. They interconnect with a network system or a data processing system through cables. FIG. 2 illustrates a conventional data processing system 200, which includes a server 202, a switch (or hub) 204, a data storage system 206, and a workstation 208. The switch 204 interconnects with the server 202 via a cable. The workstation 208, which may also interconnect with the switch 204 via a cable, can access the storage system 206 through the switch 204. Through the switch 204, the workstation 208 is also interconnected to the server 202. The server 202 manages the data storage system 206 and allows for data to be transferred between the storage system 206 and the workstation 208. For example, the workstation 204 may send a request to the server 202 via the switch 204 for a particular set of data. The server 202 receives and analyzes the request and sends a request to the data storage 206 via the switch 204 to retrieve the particular data set and send to the workstation 208. Alternatively, the server 202 may requests the data storage 206 to send the data to the workstation 208 directly.

In most cases, the switch 204 is the connecting device that provides interconnections for all components within the data processing system 200. The switch 204 (or the hub) may comprise a plurality of switch ports similar to the switch ports 10 shown in FIG. 1. Some switch ports are dedicated for connection to the host computers or workstations 208 and some switch ports are dedicated for the data storage systems 206 and the server 202. Often, these switch ports appear identical thus, it is difficult to determine which switch ports are for the workstation 208 and which switch ports are for the data storage systems 206 and the server 202.

In most cases, it is not desirable to allow inadvertent disconnection to certain switch ports. For example, an inadvertent disconnection of the data storage system 206 and the server 202 from the switch 204 may cause disruption or disablement of the data processing system 200. An inadvertent disconnection may be caused by allowing access to all of the switch ports in the switch 204 and/or by having the switch ports appear identical or similar. Also, the switch ports are often interchangeable making it more difficult to distinguish between the ports and their respective connection cables. Currently, markings, coloring, or tapings are affixed or incorporated to the certain switch ports where disconnections are not allowed or where disconnections will cause detrimental effect to the data processing systems. Even with these measures, inadvertent disconnections are not preventable since any one of the connections to the switch could be disconnected at any time and markings/tapings are only warnings that may be missed or ignored.

In addition to inadvertent disconnection, some components need to be connected to the switch from an angle. For example, the components may be placed behind the switch or behind the switch port. Thus, to connect to the switch, the connection cable needs to make some sharp turns, for example, a 90-degree turn or a 180-degree turn, from the switch port to get to the components. Bending, turning, or twisting the connection cables to get to the components may cause damage to the cables or causes unreliable operation. Often, a large clearance space is needed to accommodate the bending radii of these connection cables to prevent damages to the cables.

SUMMARY

It is useful to provide an interconnecting device that allows some connection ports to be physically restricted. It is further useful to provide an apparatus that allows connections to the interconnecting device in a small/constrained space.

In one exemplary embodiment of the present invention, an adapter that can be incorporated into an interconnecting device having physically restricted access is disclosed. The adapter comprises a backboard having a first end, a second end, a connector coupling to the first end, and a receptacle coupling to the second end. The connector has first conductive elements and the receptacle has second conductive elements. A plurality of conductive lines coupling to the backboard electrically interconnects the first conductive elements of the connector to the second conductive elements of the receptacle. The connector allows connection from the adapter to the interconnecting device and the receptacle allows connection from a particular component to the adapter. The adapter thus connects the particular component to the interconnecting device.

In one exemplary embodiment of the present invention, an interconnecting device for a data processing system is disclosed. The interconnecting device comprises a first plurality of connection ports reserved for connections with first components of the data processing system. The interconnecting device further comprises a second plurality of connection ports reserved for connections with second components of the data processing system. The interconnecting device has a housing which includes an exterior surface which includes the first and the second plurality of connection ports. The interconnecting device has a housing which includes an exterior surface which includes the first and the second plurality of connection ports. An adapter comprising a backboard having a plurality of connectors coupling to a first end and a plurality of receptacles coupling to a second end of the backboard is coupled to the interconnecting device. Each connector further has first conductive elements and each receptacle has second conductive elements wherein the first conductive elements and the second conductive elements are electrically interconnected by a plurality of conductive lines coupling to the backboard. The first components (e.g., the storage devices in a storage network) can be coupled to the receptacles of the adapter. The connectors of the adapter are coupled to the first plurality of connection ports. The first components are thus electrically connected to the interconnecting device. These first components may be considered internal components of the data processing system and they are controlled by the interconnecting device at least to some extent. A cover is placed over the first plurality of connection ports to physically restrict access to the first plurality of connection ports.

In another exemplary embodiment of the present invention, a storage network is disclosed. The storage network comprises an interconnecting device having a first plurality of connection ports and a second plurality of connection ports, wherein a cover is placed over the first plurality of connection ports to physically restrict access to the plurality of connection ports. An adapter is coupled to the interconnecting device. The adapter comprises a backboard having a plurality of connectors coupling to a first end of the backboard and a plurality of receptacles coupling to a second end of the backboard. Each of the connectors of the adapter has first conductive elements and each of the receptacles has second conductive elements wherein the first conductive elements and the second conductive elements are electrically interconnected by a plurality of conductive lines coupling to the backboard. Each of the plurality of connectors is coupled to one of the first plurality of connection ports to electrically couple the adapter to the interconnecting device. At least one data storage device is coupled to one of the plurality of receptacles. The adapter thus electrically connects at least one data storage device to the interconnecting device. At least one workstation is coupled to one of the second plurality of connection ports to electrically couple the workstation to the interconnecting device. Data are transferred between the at least one data storage device and the at least one workstation via the interconnecting device.

In another exemplary embodiment of the present invention, a storage system is disclosed. The storage system comprises a switch or a hub having a first plurality of connection ports and a second plurality of connection ports on an exterior surface of the housing of the switch, wherein a cover is placed over the first plurality of connection ports to physically restrict access to the first plurality of connection ports. The cover is coupled to the housing and may be an integral part of the housing or may be removably coupled to the housing. An adapter is coupled to the switch, the adapter comprises a backboard having a plurality of connectors coupling to a first end of the backboard and a plurality of receptacles coupling to a second end of the backboard. Each of the connectors has first conductive elements and each of the receptacles has second conductive elements wherein the first conductive elements and the second conductive elements are electrically interconnected by a plurality of conductive lines coupling to the backboard. Each of the plurality of connectors is coupled to one of the first plurality of connection ports to electrically couple the adapter to the switch. A controller is interconnected to one of the plurality of receptacles to electrically couple the controller to the switch. At least one data storage device is interconnected to another of the plurality of receptacles. At least one workstation is coupled to one of the second plurality of connection ports to electrically couple the workstation to the switch. The switch or hub is configured to transfer data between at least one data storage device and at least one workstation and wherein the controller is configured to manage at least one of the storage of data and the transfer of data within the storage device.

The various embodiments of an interconnecting device may be used as a switch or hub in storage network such as a Storage Area Network (SAN) or as a Network Attached Storage (NAS) system, and the interconnecting device, together with the storage devices which it interconnects to other systems, may be considered a part of the storage network. In this case, the storage devices may be considered to be internal components (within the storage network and managed at least in part by the interconnecting device) and the other systems (e.g., a remotely located client computer system) may be considered external components.

The methods of physically restricting access to an interconnecting device and making connections to the interconnecting device in a small/constrained space of a data processing system and other exemplary embodiments are also disclosed.

BRIEF DESCRIPTION OF THE DRAWINGS

The present invention is illustrated by way of example and not limitation in the figures of the accompanying drawings, in which like references indicate similar elements and in which.

DETAILED DESCRIPTION

The exemplary embodiments of the present invention pertain to an interconnecting device for use with a data processing system wherein the interconnecting device has connection ports that are physically restricted. The interconnecting device further includes an adapter that enables cables to be connected from components to the interconnecting device in a small clearance space. The interconnecting device with physically restricted access prevents or makes difficult inadvertent or undesirable disconnection of certain components from the data processing system. In the following description, for purposes of explanation, numerous specific details are set forth in order to provide a thorough understanding of the present invention. It will be evident, however, to one skilled in the art that the present invention may be practiced without these specific details. In other instances, specific apparatus structures and methods have not been described so as not to obscure the present invention. The following description and drawings are illustrative of the invention and are not to be construed as limiting the invention.

Figure 3A:
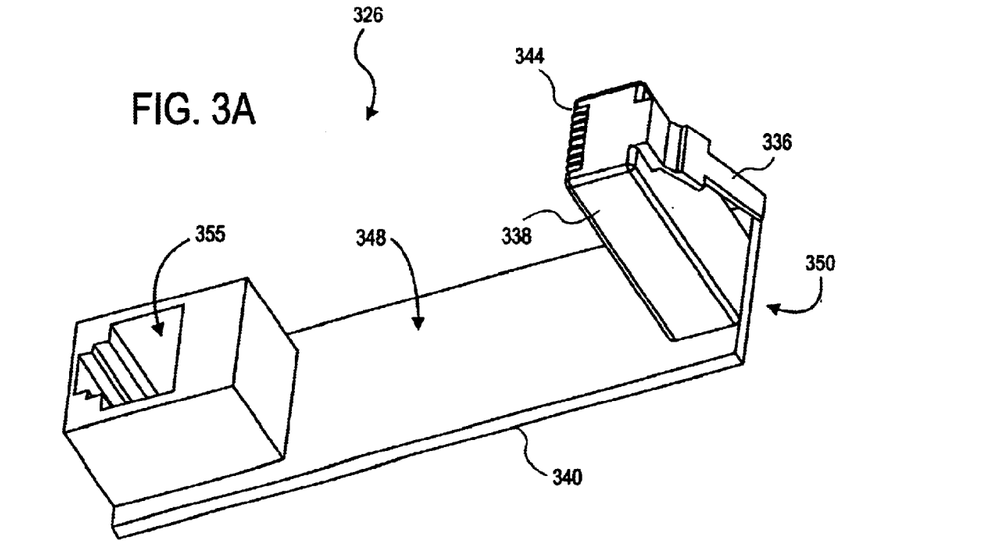
FIGS. 3A–3B illustrate an exemplary adapter in accordance with exemplary embodiments of the present invention.

FIG. 3A illustrates an exemplary adapter 326, which enables a component to connect to an interconnecting device (described below) in a small clearance space. The adapter 326 comprises a backboard 340, a connector 338 positioned at one end of the backboard 340, and a receptacle 355 positioned at the other end of the backboard 340. The connector 338 may be configured similarly to a conventional electrical connector. The connector 338 includes a latch 336, which allows the connector 338 to be locked into or released from a mating receptacle (not shown) as is well known in the art. The connector 338 further includes a plurality of conductive pins 344 made of conductive materials such as copper, aluminum, silver, gold, or other suitable metal alloys. The conductive pins 344 enable electrical connection between the connector 338 and other electrical components, for example, a connection port on an interconnecting device. The receptacle 355 includes conductive elements (not shown) similar to the conductive pins 344 to enable electrically connection from the receptacle 355 to a complimentary connector from a component.

Figure 3B:
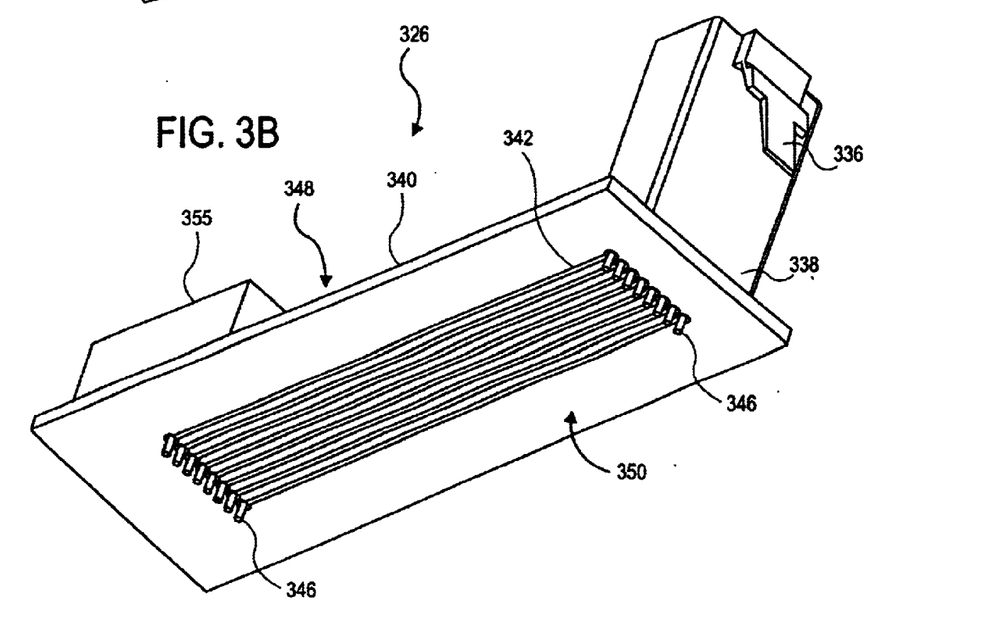

In one embodiment, the adapter 326 comprises a plurality of conductive lines 342 coupled to the side of the backboard 340 that does not have the receptacle 355 or the connector 338 attached thereto as illustrated in FIG. 3B. As shown in this figure, the receptacle 355 and the connector 338 are located on the top surface 348 of the backboard 340 and the plurality of conductive lines 342 are located on the bottom surface 350 of the backboard 340. The conductive lines 342 are made of conductive materials such as copper, aluminum, silver, gold, or other suitable metal alloys. The conductive line 342 can be printed on the backboard 340 using methods typically used to make printed circuit boards or other suitable methods. The conductive lines 342 can be coupled to the backboard 340 using adhesive or other coupling methods known in the art. In one embodiment, the conductive lines 342 are insulated or covered to prevent unnecessary exposure and to prevent short circuit of the adapter 326.

Each of the conductive lines 342 includes two ends, each of which is coupled to a conductive pin 346. In addition, each of the conductive pins 346 further electrically couples to conductive elements or conductive leads (not shown) that allow for electrical communication/connections from the conductive lines 342. In this embodiment, each of the conductive line 342 is electrically coupled to one of the conductive pins 344 via the conductive pins 346 and the conductive leads (not shown). Electrical connections between the receptacle 355 (via the conductive elements) and the connector 338 (via the conductive leads) can be established through the conductive lines 342. Using the adapter 326, on component can be electrically coupled to another component without requiring much clearance space for bending of cables.

Figure 3C:
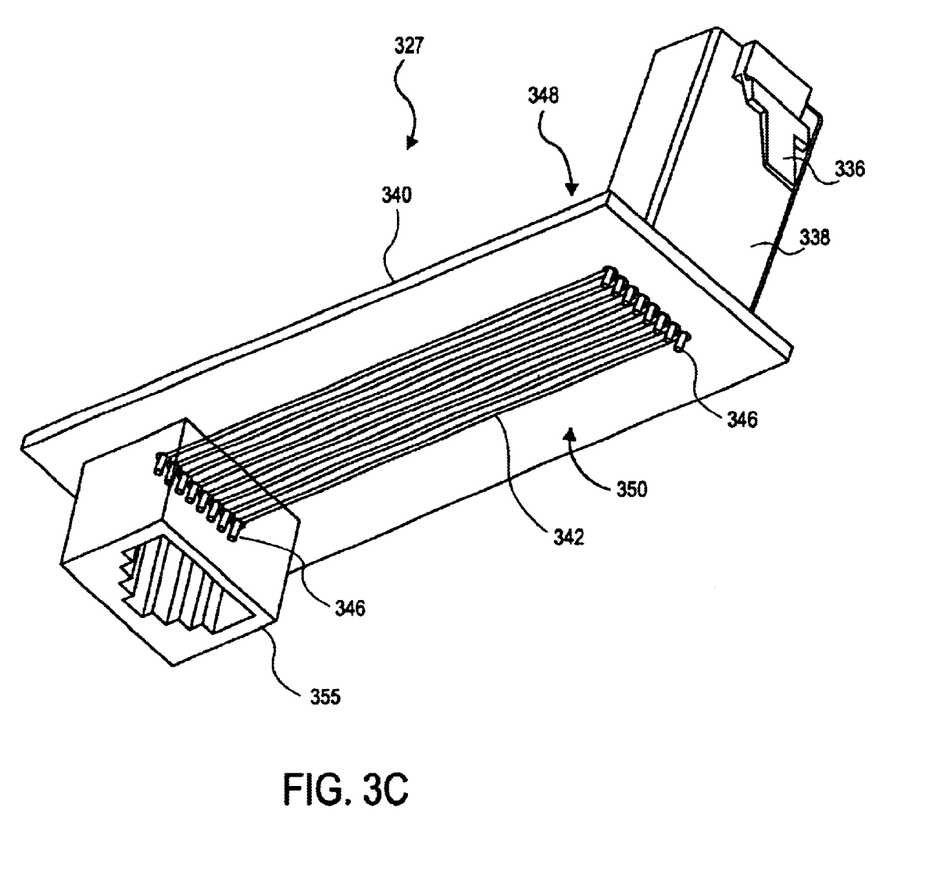
FIG. 3C illustrates another exemplary adapter in accordance with exemplary embodiments of the present invention.

In one embodiment, the connector 338 and the receptacle 355 form an angle of about 180-degree from each other, as shown in FIC 3B. In another embodiment, the connector 338 and the receptacle 355 form an angle of about 0-degree (or 360 degrees) but offset from each other as shown in FIG. 3C, adapter 327. The adapter 327 shown in FIC 3C is similar to the adapter 326 shown in FIG. 3B in all aspects except that the receptacle 355 and the connector 338 of the adapter 327 are placed on opposite surface of the backboard 340. As shown in FIC 3C, the connector 338 is placed on the top surface 340 and the receptacle 355 is placed on the bottom surface 350. The plurality conductive line 342 can be placed either on the bottom surface 350, as shown in FIG. 3C, or on the top surface 348 (not shown).

The adapter 326 (or 327) can be incorporated into an interconnecting device that has particular connection ports on the interconnecting device physically restricted. Alternatively, the adapter 326 (or 327) can be incorporated into an interconnecting device that requires connections to it to be made in a small/constrained space. Although the disclosure focuses on incorporating the adapter 326 (or 327) into an interconnecting device, it is to be understood that the adapter 326 (or 327) can be incorporated into other devices without departing from the scope of the present disclosure. The adapter 326 (or 327) can be incorporating into devices that require connections from components to components to be established in a constrained or limited space that might be smaller than allowed by the particular cables used to connect the components together. The adapter 326 (or 327) can include any numbers of connectors 338 and receptacles 355 depending on the number of ports that the adapter 326 (or 327) needs to create electrical connections for. In such event, a plurality of connectors 338 and a plurality of receptacles 355 are coupled to the backboard 340.

Figure 4A:
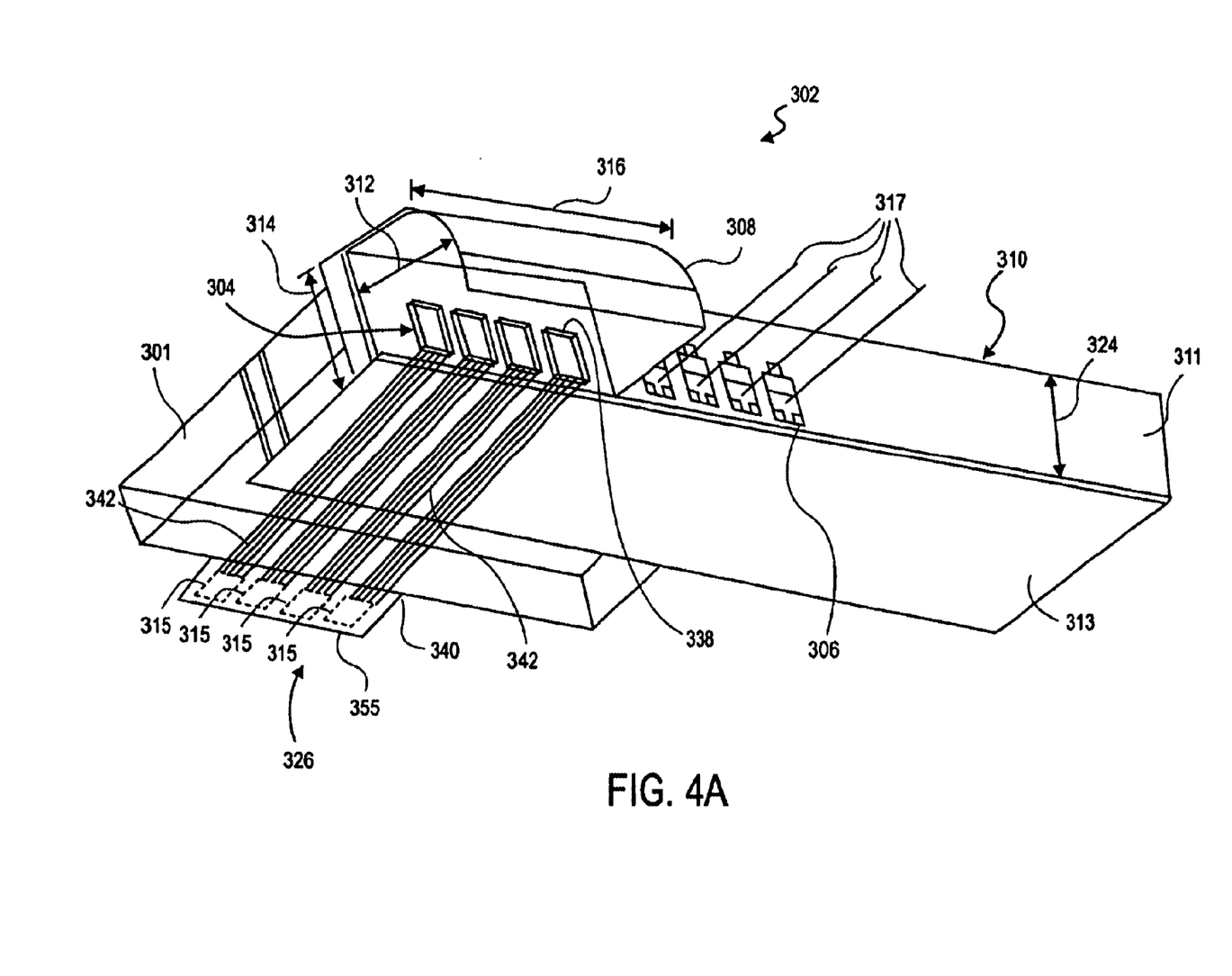
FIGS. 4A–4B illustrate an exemplary interconnecting device that includes an exemplary adapter as shown in FIGS. 3A–3C in accordance with exemplary embodiments of the present invention.
Figure 4B:
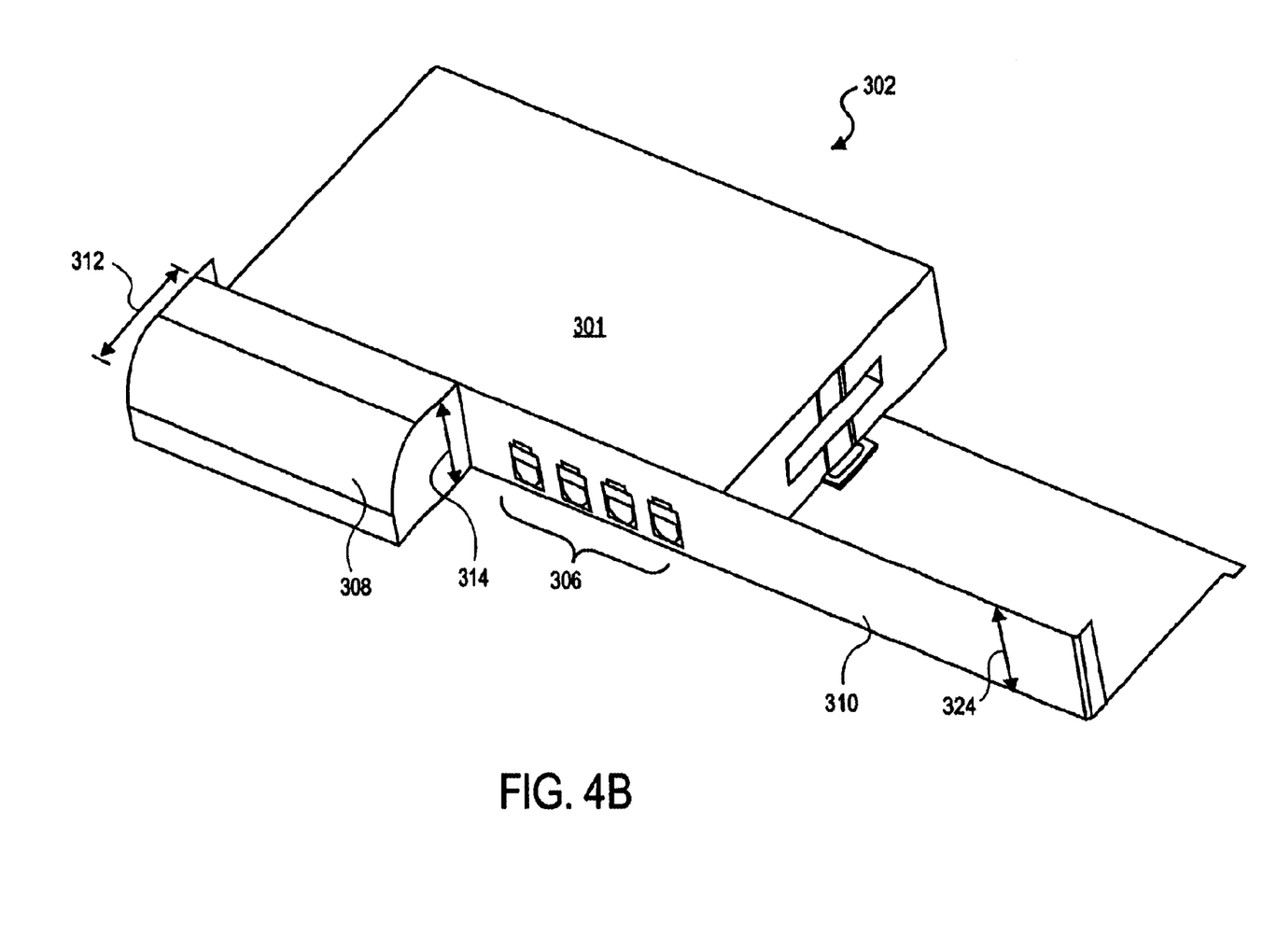

FIG. 4A and FIG. 4B illustrate different views of an exemplary embodiment of an interconnecting device 302 that can be incorporated into a data processing system (e.g., a data storage network, a data storage system, a data storage subsystem or a data storage rack). The interconnecting device 302 comprises a housing 301, a first plurality of connection ports 304 (ports 304), a second plurality of connection ports 306 (ports 306), a cover 308, and an input/output panel 310. The interconnecting device 302 can be a switch, a hub, a router, a switch router, or other interconnecting device configured or modified in accordance to the exemplary embodiments of the present invention. The ports 304 and 306 can be conventional interconnecting ports such as switch ports, hub ports, and in one embodiment, the ports 304 and 306 are GBIC ports. The housing 301 encloses all of the necessary electrical components of the interconnecting device 302 as is well known in the art.

In one embodiment, ports 304 and the ports 306 are extended into and located on the input/output panel 310 to provide an easy access or interface to the ports 304 and 306. Some or all of the ports from the ports 304 and 306 can be physically restricted. To prevent undesirable or inadvertent disconnections, ports that are dedicated to connection with internal or important components of the data processing system should be physically restricted. Physically restricting the ports indicates that the physical accesses to the ports are restricted, prevented or made difficult thereby preventing one from simply reaching the ports and accessing the ports. Alternatively, physically restricting the ports makes access to the ports difficult such that inadvertent disconnection is not easy.

In one embodiment, the ports 304, which are those reserved for connections with the internal components are physically restricted. The ports 306 are not physically restricted, thus, they are exposed for easy of connection. To physically restrict access to the connection ports on the interconnecting device 302, the cover 308 is affixed or placed over the ports 304. The cover 308 does not electrically restrict access to the first plurality of connection ports 304 thus, allowing for change in the internal connections whenever necessary. The cover 308 prevents inadvertent (or makes difficult) disconnection of the connections between the internal components and the ports 304. For instance, to access the ports 304, one must go behind or underneath the cover 308 to get to the ports 304. Alternatively, to access the ports 304, one must detach, remove, or decouple the cover 308 (if that is allowed as configured by the manufacturer of the interconnecting device 302).

The interconnecting device 302 with the cover 308 enables the manufacturers of the data processing systems that incorporate/integrate the interconnecting device 302 to control which components of the data processing systems can be disconnected and which cannot be disconnected. For example, those components that should not be easily disconnected are connected to the interconnecting device through the ports 304 which are physically restricted by the cover 308. And, those components that can be replaced, exchanged, or otherwise disconnected without affecting major functions of the data processing system are connected to the interconnecting device through the ports 306 that are exposed. Additionally, the interconnecting device 302 with the cover 308 allows the manufacturers of the data processing systems to create easy access for the client data processing systems (or host data processing systems) to be connected to these data processing systems (e.g., via the ports 306 that are exposed) while restricting access to connections of the internal components of other essential components that should not be disconnected from these data processing systems with the cover 308.

Internal components and external components of the data processing system that incorporates/integrates the interconnecting device 302 can be connected to either the ports 304 or 306. In one embodiment, the internal components are connected to the interconnecting device 302 through the ports 304 and the external components are connected to the interconnecting device 302 through the ports 306.

Internal components can be referred to components of the data processing system that are enclosed within a housing (e.g., a rack, a bay, or a cabinet) that contains the data processing system. The internal components can also be referred to components that are the core or essential components of the data processing system. For example, when the data processing system is a data storage network, the internal components may be referred to data storage devices, data storage servers, or data storage systems where data are stored. Additionally, the internal components may be referred to a server that manages the data processing system. Alternatively, when the data processing system is a data storage rack, the internal components may be referred to data storage devices contained within the rack/bay/cabinet that physically contains the data processing system. Additionally, the internal components may be referred to a controller or a storage controller that manages the data storage rack. The data processing system can also be a computer subsystem of a larger network data processing system wherein multiple subsystems are interconnected to form the network computer. Here, the internal components for each subsystem are referred to components that are contained within the housing that is used to physically contain a particular subsystem. In a larger network type of data processing system, internal components may be components that are essential or necessary for the data processing system to function properly, for example, a central server, a controller, a data storage device, which is connected to the data processing system. It is to be appreciated that the data processing system can be an open system and need not be contained within a housing.

External components are typically host data processing systems, workstations, client data processing systems, or other components that are external to the data processing system or the subsystem. External components can also be referred to components that reside outside of the main housing that stores most components of the data processing system. For example, when the data processing system is a data storage network with several computer subsystems, external components are those components that reside outside of each subsystem. In some cases, external components can be an additional data storage device externally connectable to the data processing system or the subsystem, for example, as in embodiments where the data storage devices can be expanded or added to the data processing system externally.

In one embodiment, the internal components are components that are connected to the data processing system in a permanent or substantially permanent fashion whereas the external components are components that are connected to the data processing system in a non-permanent or in an interchangeable fashion.

In one embodiment, the ports 304 are reserved for internal components of the data processing system to connect to the interconnecting device 302. The ports 306 are reserved for external components of the data processing system to connect to the interconnecting device 302. Alternatively, the ports 304 are reserved for components that are permanently or substantially permanently connected to the interconnecting device 302. The ports 306 are reserved for components that are not permanently or substantially permanently connected to the interconnecting device 302. In one embodiment, the internal connections are reserved for components that are connected to the interconnecting device 302 substantially permanently or in a way that disconnection requires a special access to the data processing system. The external connections to the interconnecting device 302 are reserved for components that can be interchanged, replaced, changed, or otherwise disconnected. For example, connections from host data processing systems, workstations, or client data processing systems that need to access the data processing system are considered external components. These computers can be changed without affecting the functions of the data processing system.

The input/output panel 310 allows for easy connections to the interconnecting device 302. Without the input/output panel 310, wires, cables, or connection lines need to be extended from the interconnecting device 302 to the outside of the interconnecting device 302 to allow for connections to the device 302. Then, an input/output panel would need to be attached to the data processing system, typically, on the surface of the data processing system where the interconnecting device 302 would be coupled to in order to allow external components to connect to the interconnecting device 302. Including the input/output panel 310 directly on the interconnecting device 302 allows the external and/or internal components to connect directly to the interconnecting device 302 without the need for additional wirings or cables. As shown in FIG. 4A and FIG. 4B, the ports 304 and 306 extend into the input/output panel 310 to form a plurality of receptacles or jacks and to act as interfaces to allow connections to the ports 304 and 306. The internal or external components are equipped with cables having mating plugs or connectors that can be plugged into the ports 304 and 306 to establish connections from these components to the interconnecting device 302.

In one embodiment, the cover 308 is coupled or is attached to the input/output panel 310. The cover 308 can be created or made separately and then be placed, adhered, or coupled to the input/out panel 310 using conventional methods (e.g., by using adhesive or mechanical connections). In one embodiment, the cover 308 can be permanently affixed to the input/output panel 310. In another embodiment, the cover 308 may be coupled to the input/output panel 310 in a way that allows the cover 308 to be removed if necessary. In yet another embodiment, the cover 308 may also be coupled in a way that allow the cover 308 to slide from one side of the input/output panel 310 to the other side. This is especially useful when the cover 308 needs to physically restrict access to different ports, for example, the ports 306. In this embodiment, the cover 308 may be slide over to the ports where restriction to access is necessary. Also in this embodiment, the cover 308 should be provided with a locking mechanism to allow the cover 308 to be locked into position relative to the input/output panel 310. In yet another embodiment, the cover 308 is an extension of the input/output panel 310 and can be created at same time and out of the same piece of starting material with the input/output panel 310.

The cover 308 has a dimension that is sufficient to physically restrict external access to the first plurality of connection ports 304. In other words, the cover 308 is sufficiently dimensioned to cover or substantially cover all of the ports 304. In one embodiment, the cover 308 has a height 314 and a length 316. The height 314 can be (but need not be) the same as the height 324 of the input/output panel 310. The length 316 is sufficiently long to cover all of the first plurality of connection ports 304 that are reserved for internal connections.

In one embodiment, the ports 306 and 304 are placed on the same side 311 of the interconnecting device. Having all connection ports on the same side of the interconnecting device is a common approach in the field. Often, internal components and external components to be connected to the interconnecting device 302 are not situated on the same side. The internal components are often and more likely placed behind the ports 306 and 304. Thus, connection cables from the port 304 (or 306) need to turn at least 90-degrees or even 180 degrees from the ports. Turning the connection cables will require the interconnecting device 302 to reserve some clearance space to accommodate this turning or bending of the cables. The adapter 326 or 327 described previously can be incorporated into the interconnecting device 302 to minimize this minimum clearance space and prevent unnecessary bending or turning of the connection cables.

As shown in FIG. 4A, the adapter 326 previously described is incorporated into the interconnecting device 302. The adapter 326 may include a number of connectors 338 and receptacles 355. In one embodiment, a plurality of connectors 338 are electrically interconnected with the first plurality of connection ports 304 wherein each connector 338 is plugged into a port 304. As described previously, the connectors 338 are placed at one end of the backboard 340. The backboard 340 extends across the bottom side 313 of the interconnecting device 302 allowing the receptacles 355 placed at the remaining end of the backboard 340 to be exposed at the end of the interconnecting device 302. In one embodiment, the receptacles 355 are at about 180-degree angle from the connectors 338. In one embodiment, internal components (not shown) are connected to the receptacles 355. In one embodiment, the internal components are equipped with cable 315 having connectors (not shown) that are complimentary to the receptacles 355 so that these connectors can be plugged into the receptacles 355 to establish the connections between the internal components and the interconnecting device 302.

The cover 308 has a width 312 that is sufficiently large to accommodate the connections from the connectors 338 into the ports 304. The width 312 can be much smaller than when the adapter 336 is not used because the adapter 326 eliminates the need to bend cables (for example, for fitting into a constrained connection space). The adapter 326 also prevents damages to the cables that may be caused by turning, bending, and/or twisting of the cables to fit into a confined space of the data processing system. As previously described, the adapter 326 is equipped with the conductive lines 342, the connectors 338, and the receptacle 355 which allows for connecting components from the back side of the interconnecting device 302 to the front side of the interconnecting device 302 without bending, twisting, and/or turning of the cables.

It is to be appreciated that although FIG. 4A illustrates that connections from components to the ports 340 is made with a 180-degree angle, other configurations are possible, for example, components can be connected to the ports 304 at a 90-degree angle. The suitable angle depends on how the components are situated relative to the interconnecting device 302 and/or the side 311 of the interconnecting device 302. In other embodiments, the suitable angle depends on where the components are situated relative to the side of the interconnecting device 302 where the ports are located.

It is to be appreciated that restricting the port 304 is only an example of how the cover 308 may be used to physically restrict access to a particular set of ports. The cover 308 can be used to physically restrict access to a other ports as necessary, for example the ports 306. Alternatively, the cover 308 may also be used to physically restrict some ports from the first plurality of connection ports 304 and some ports from the second plurality of connection ports 306. Thus, the cover 308 is to be placed over the area that includes the ports that need to be physically restricted.

In one embodiment, both the external components and the internal components connect to the interconnecting device 302 from one side of the interconnecting device 302 as shown in FIG. 4A. In this embodiment, the ports 304 and the ports 306 are located on the same side, side 311, of the interconnecting device 302. In one embodiment, the side 311 is the side facing the front of the data processing system. In another embodiment, the side 311 is the side facing the back of the data processing system. In yet another embodiment, the side 311 faces the external environment of the data processing system.

Continuing with FIG. 4A, in one embodiment, the external components (not shown) are connected to the ports 306 of the interconnecting device 302 using cables 317 with no need for bending in the cables 317 to fit into any confined space. The cable 317 can also be bent as needed to fit into an allowed space in other embodiments. The cables 317 may have connectors (not shown) that are complimentary to the ports 306 so that the connectors can be plugged into the ports 306 to establish connections between the external components and the interconnecting device 302.

In one embodiment, the internal components are connected to the ports 304 of the interconnecting device 302 via the adapter 326 (or 327). Typically, spaces for connections to the ports 304 are limited and/or constrained. For example, the space available for connection would be constrained when the data processing system that incorporates the interconnecting device 302 is confined or contained in a housing or within a small space/area. Additionally, the connection space would be constrained when both components, external and internal, are to be connected from one side of the interconnecting device 302, for example, from the side 311. Moreover, the connections space is even more limited when the interconnecting device 302 is to be mounted on the housing such that it is easy to connect external components to the interconnecting device 302. In this way, the interconnecting device 302 is placed almost against the surface of the housing for ease of accessing the ports (e.g., the ports 306) reserved for the external components. Thus, the remaining ports, (e.g., the ports 304) being on the same side are also placed almost against the surface of the housing. Therefore, allowing the internal components to connect to the ports in as little space as possible is desirable. The adapter 326 (or 327) allows internal components to be connected to the interconnecting device 302 with minimally needed space. In one embodiment, each of the internal components to be connected to the interconnecting device 302 has a cable 315 with complimentary or mating connector (not shown) to the receptacle 355 on the backboard 340. The internal components are thus electrically connected to the adapter 326 (or 327) via the receptacle 355. The conductive lines 342 then electrically connect the internal components to the connectors 338. The connectors 338 on the other end of the backboard 340 then electrically connect the internal components to the interconnecting device 302. In this embodiment, the connectors 338 are plugged into the ports 304 to complete the connection circuit. Configuring the adapter 326 as shown in FIGS. 3A–3B, and 4A allows the internal components to be placed behind the interconnecting device 302, substantially behind the interconnecting device 302, or at about 180-degree angle with the ports 304. Configuring the adapter 327 as shown in FIG. 3C allows the internal components to be connected to the interconnecting device 302 at an angle of about 90-degree. The adapters 326 or 327 can be configured to allow the connectors 338 and the receptacles 355 to be placed at any convenient angle to each other. The adapters 326, and 327 thus allow the internal components to be placed at any convenient location relative to the interconnecting device 302 and in one embodiment, relative to the ports 304 without the need of bending, twisting, or turning the cables excessively.

In one embodiment, accesses to the ports 304 are restricted after the internal connections to the ports 304 are made. In the embodiment where the internal components include at least one of the data storage systems and data storage system controllers, connections from the interconnecting device 302 to these internal components via the ports 304 and the cables 315 are made before the cover 308 is affixed to the input/output panel 310 to prevent physical access to the ports 304.

In another embodiment, the interconnecting device 302 is configured with the cover 308 prior to the connection of the interconnecting device 302 to the internal components. In the embodiment where the internal components include at least one of the data storage systems and data storage system controllers, the cables 315 from the internal components can be plugged into the jacks 304 from underneath the interconnecting device 302.

Figure 5:
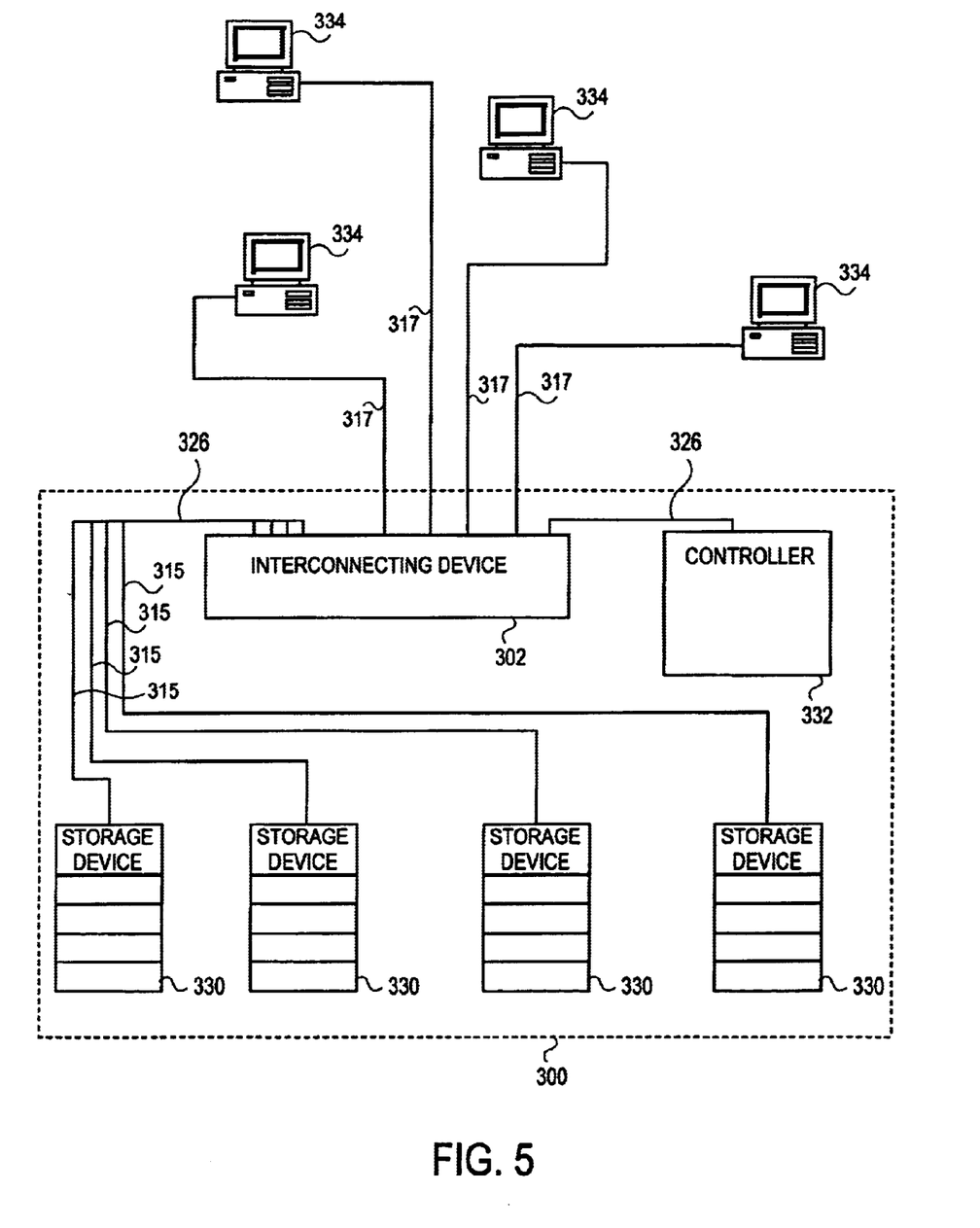
FIG. 5 illustrates an exemplary data processing system that incorporates an exemplary interconnecting device having an adapter in accordance with exemplary embodiments of the present invention.

In one exemplary embodiment, FIG. 5 illustrates a data processing system 300 that incorporates or integrates an interconnecting device 302 that has connections wherein some of which are physically restricted and wherein connections to the interconnecting device 302 are made in a small or constrained space by an adapter 326, as previously described. The data processing system 300 can be a data storage system, a data storage rack, a data storage network, or other data processing systems involving in data transfers.

The data processing system 300 comprises at least one data storage device 330, and as illustrated in FIG. 5, four data storage devices 330 are included. In one embodiment, the data processing system 300 also includes a controller 332, which manages data transfers within and/or from the data processing system 300. The data processing system 300 comprises an interconnecting device 302 as previously described. The interconnecting device 302 allows for host computers or workstations 334 to connect to the data processing system 300. Additionally, the interconnecting device 302 also allows for other external components of the data processing system 300 (e.g., another data storage device, not shown), to be connected to the data processing system 300. The interconnecting device 302 also allows for internal components of the data processing system 300 (e.g., the data storage device 330 and the controller 332) to be connected to the data processing system 300.

As described above, the interconnecting device 302 includes the ports 304 which are reserved for internal connections and the ports 306 which are reserved for external connections. The external and/or internal components can be connected to the interconnecting device 302 as previously described. In one embodiment, each of the data storage devices 330 is coupled to one of receptacles 355 included on the adapter 326 the connectors 338 on the adapter 326 are coupled to the ports 304 thus electrically couple the data storage device 330 to the interconnecting device 302. Each of the workstations 334 is coupled to one of the ports 306 of the interconnecting device 302. And, the controller 332 is connected to one of the receptacles 355 included on the same adapter 326 as used for connecting the data storage device 330 to the interconnecting device 302 or on a different adapter 326 in similar fashion. The interconnecting device 302 thus can include a plurality of adapters 326 as necessary. Data are transferred between at least one data storage system 334 and at least one workstation 330 via the interconnecting device 302. The controller 332 manages the data transfers between the workstation 334 and the data storage device 330. The adapter 326 is used to establish electrical connections among the interconnecting device 302, the data storage devices 330, and the controller 332 and the interconnecting device 320.

In one embodiment and as illustrated in FIG. 5, the external components such as the workstations 334 are connected to the interconnecting device 302 directly with no bending of the cables 317 at the connection points (at the ports 306) on the interconnecting device 302. The internal components such as the data storage devices 330 are connected to the interconnecting device 302 from behind the interconnecting device 302.

In one embodiment, the interconnecting device 302 allows for communication channels to be established between the data storage device 330 and the workstations 334. Accesses to the connections for the internal components such as the data storage device 330 and the controller 32 are physically restricted by the cover 308 (see FIG. 4A) placed over the ports 304 so that inadvertent disconnection of the data storage devices 330 and/or the controller 332 is prevented or at least made difficult. One reason for this is that disruption to the internal connection (e.g., connections with the data storage devices 330 and the controller 332) may cause disruption to the function of the data processing system 300. For example, inadvertent disconnection of the data storage device 330 or the controller 332 while data is being transferred from either one of these components to any one of the workstation 334 will cause disruption to the data transfer or the data processing system 300.

In one embodiment, connections from the workstations 334 to the interconnecting device 302 can be flexible or interchangeable. For example, one workstation 334 can replace another workstation 334. Alternatively, another external components (e.g., an additional data storage device) can replace a workstation 334. Connections for external components thus, should be easily accessible and/or interchangeable. In one embodiment, connection from the controller 332 to the interconnecting device 302 is made to be permanent or substantially permanent. Additionally, connections for the data storage device 330 to the interconnecting device 302 are permanent or substantially permanent. In the embodiment where the interconnecting device 302 has all of the ports 304 and 306 on one side, accesses to the connections from the internal components are physically restricted by the cover 308 to prevent inadvertent disconnection of the internal components of the data processing system 300 (e.g., the data storage device 330 and the controller 332).

The interconnecting device 302 transmits command packets between the workstations 334, the data storage devices 330, and the controller 332. In one embodiment, a particular workstation 334 makes a request for a particular data set from a particular data storage device 330. The workstation 334 sends a command packet to the controller 332 via the interconnecting device 302, which transmits the command packet to the controller 332. Upon analyzing and/or translating of the command packet, the controller 332 routes the command packet to the appropriate data storage device 330. The controller 332 may determine the appropriate data storage device 330 that stores the particular data set that the particular workstation 334 requests and routes the request to that particular data storage device 330. In one embodiment, the controller 332 generates another command packet and sends it to the data storage device 330 in accordance to the command packet sent by the workstation 334. Data is then retrieved from the data storage device 330 and sent to the workstation 334 via the interconnecting device 302. The data can be routed directly to the workstation 334 via the interconnecting device 302 or can be routed back to the controller 332 which will then transmit the data to the appropriate workstation 334. It is to be appreciated that there are several ways of transferring data to the appropriate destination. For instances, in some embodiments, a controller 332 are not needed to manage the data transfer. Instead, the interconnecting device 302 can include a processor that can manage the data transfers from and to the interconnecting device 302.

In one embodiment, the interconnecting device 302 includes a CPU (Central Processing Unit) (not shown) and a memory. A communication bus is coupled to the CPU. And, a memory bus couples the CPU to the memory. The memory stores data routing information (e.g., as generated by the controller 332). The interconnecting device 302 uses the data routing information to route data directly between the workstations 334 and the data storage devices 330. In one embodiment, data need not be routed back to the controller 322 before it is routed to the appropriate workstations 334. The controller 332 may include instructions in the command packet sent to the data storage device 330 to instruct the data storage device 330 to retrieve the particular data set and send it directly to the particular workstation 334 that requests for the particular, data set. Many well known protocols can be used for the data transfer within, to, and from the data processing system 300. In one embodiment, a SCSI (Small Computer System Interface) well known in the art is implemented for the transfer of data within, to, and from the data processing system 300.

In one embodiment, the controller 332 manages the data processing system 300. The controller 322 can be enclosed within the data processing system 300, for example, as in an embodiment where the data processing system 30 is contained in a housing (e.g., rack, bay, or cabinet). Alternatively, the controller 332 can be external to the data processing system 300 as in an embodiment where data processing system 300 is a subset of a larger data storage network. The controller 332 can also be a server that is included within the data processing system 300 as in an embodiment where the data processing system 300 is a large data storage network operated over the Internet. The controller 332 is capable of managing data transfer and/or retrievals between the workstations 334 and the data storage systems 330 and within the data processing system 300. The controller 332 can receive and/or send command, status, or data packets from either the workstations 334 or the data storage devices 330. The controller 332 can also translate command, status, or data packets sent from the workstations 334 wherein the packets may make requests for data from any of the data storage devices 330. The controller 332 can also transmit the packets from the workstations 334 to appropriate data storage devices 330 either as identified by the workstations 334 or by the controller 332 performing analysis of the requests. The controller 332 can also transmit a command, status, or data packets from the data storage device 330 to any particular workstation 334 as destination.

In one embodiment, the data processing system 300 does not include the controller 332. Data transfer can be performed directly between the workstations 334 and the data storage devices 330. In this embodiment, the interconnecting device 302 is configured to be able to manage the data transfers for the data processing system 300.

In one embodiment, the controller 322 is one of the controllers disclosed in the U.S. Pat. Nos. 6,370,605 and 6,070,251, which are hereby incorporated by reference.

The workstations 334 are host data processing systems, servers, or stand-alone computers that need access to the data processing system 300. Alternatively, the workstations 334 can be client data processing systems that subscribe to the data service of the data processing system 300.

Each of the data storage devices 330 can be a data storage server or other system that can store data. The data storage device 330 can be a rack mountable storage having multiple magazines or an array of disk drives contained in a bay or a cabinet. The magazines are individual disk drives that store particular sets of data. The magazines can be hot swappable, fully self-contained and have a predetermined data storage capacity. In one embodiment, each data storage device 330 may typically include more than one storage disk and the storage disks (not shown) may be organized into disk arrays in case of Redundant Array of Independent Disks (RAID)-based storage architecture. The data storage device 330 may be one or more discrete physical devices, e.g., disk drives, tape drives, etc. Alternately, the data storage device 330 may be a storage subsystem with more than one disk drives and a resident RAID controller. Additionally, the data storage device 330 may allow hot-swapping in the event of a disk failure. The data storage disks may implement magnetic, optical or any other method of storing high-volume data. Some examples of storage disks include CD ROMs, magnetic tapes, videodisks, etc. Protection from power failures may also be part of the data storage device architecture. In one embodiment, the controller 332 may manage storage redundancy built into the data storage device 330. The controller 332 may also be configured to manage data recovery in the event of a storage device hardware failure. The controller 332 may also issue appropriate recovery commands in the event of data volume rebuilding after the hardware failure. One or more RAID algorithms may also be used by the controller 332 to manage such data storage and recovery operations. In an alternative embodiment, the data storage device 330 may include a resident RAID controller (not shown). In this configuration, the control 332 may not need to perform RAID operations and may simply issue data transfer commands without specifying the RAID levels for data storage.

Figure 6:
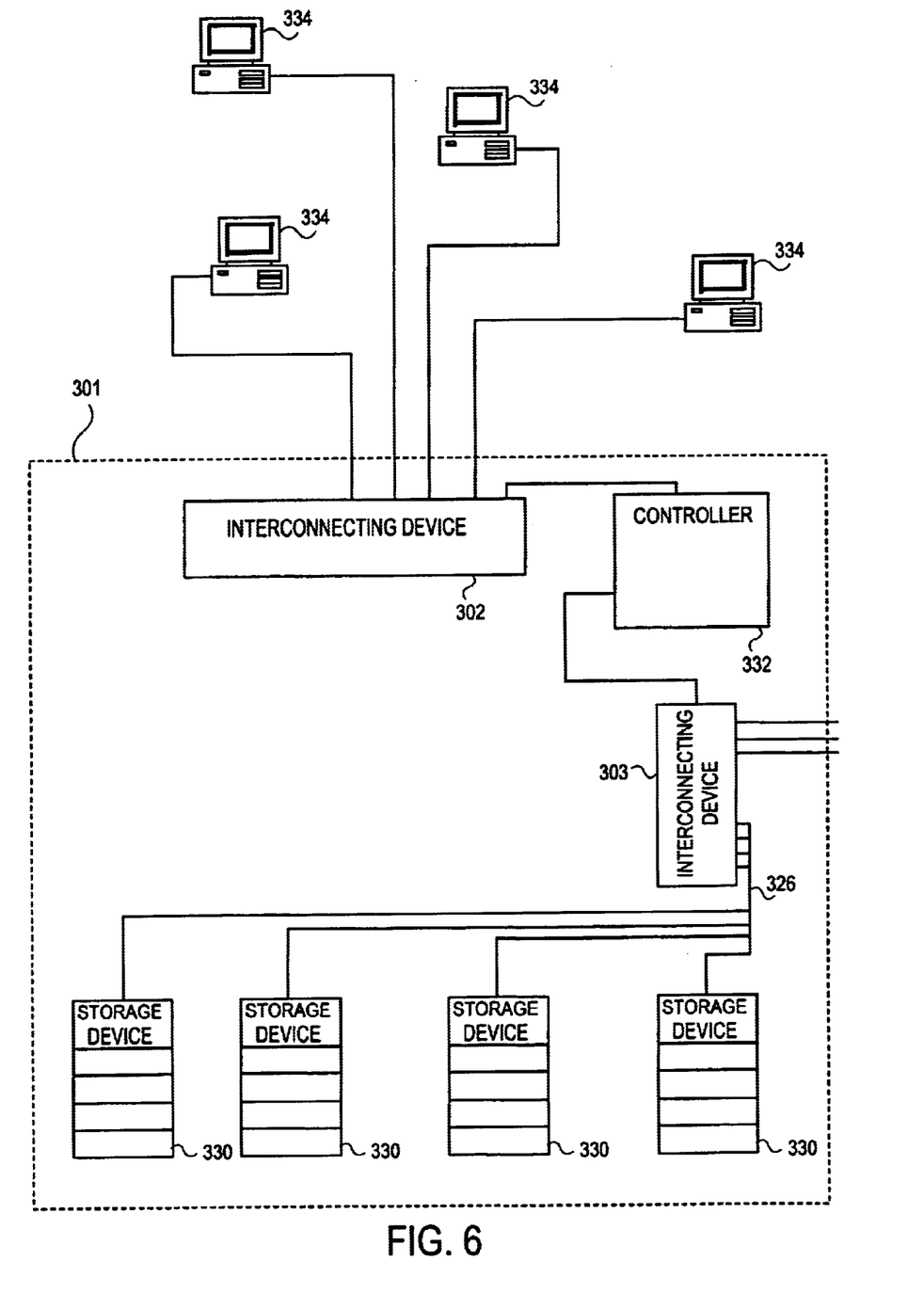
FIG. 6 illustrates another exemplary data processing system that incorporates an exemplary interconnecting device having an adapter in accordance with exemplary embodiments of the present invention.

FIG. 6 illustrates another exemplary embodiment of a data processing system 301. The data processing system 301 is similar to the data processing system 300 described above except that an additional interconnecting device 303, which is also similar to the interconnecting device 302, is included. Thus, the data processing system 301 incorporates or integrates the interconnecting device 302 and the interconnecting device 303, both of which has connections wherein some of which are physically restricted and which are made in small/constrained spaces (via the adapters) as previously described. Similar to the data processing system 300, the data processing system 301 can be a data storage system, a data storage rack, a data storage network, or other data processing systems involving in data transfers. The data processing system 301 comprises at least one data storage device 330 and as illustrated in FIG. 6, four data storage devices 330 are included. In one embodiment, the data processing system 300 also includes a controller 332, which manages data transfers within and/or from the data processing system 300.

The data processing system 301 is similar to the data processing system 300 with the following additions. The interconnecting device 302 allows for host computers or workstations 334 to connect to the data processing system 300. Additionally, the interconnecting device 302 also allows for other external components of the data processing system 300 (e.g., another data storage device, not shown), to be connected to the data processing system 300. The interconnecting device 303 allows for internal components of the data processing system 300 (e.g., the data storage devices 330 and the controller 332) to be connected to the data processing system 300. The interconnecting device 303 also connects the internal components such as the data storage devices 330 to the controller 332. Additionally, the interconnecting device 303 also allows for additional external components to be connected into the data processing system 301.

Figure 7:
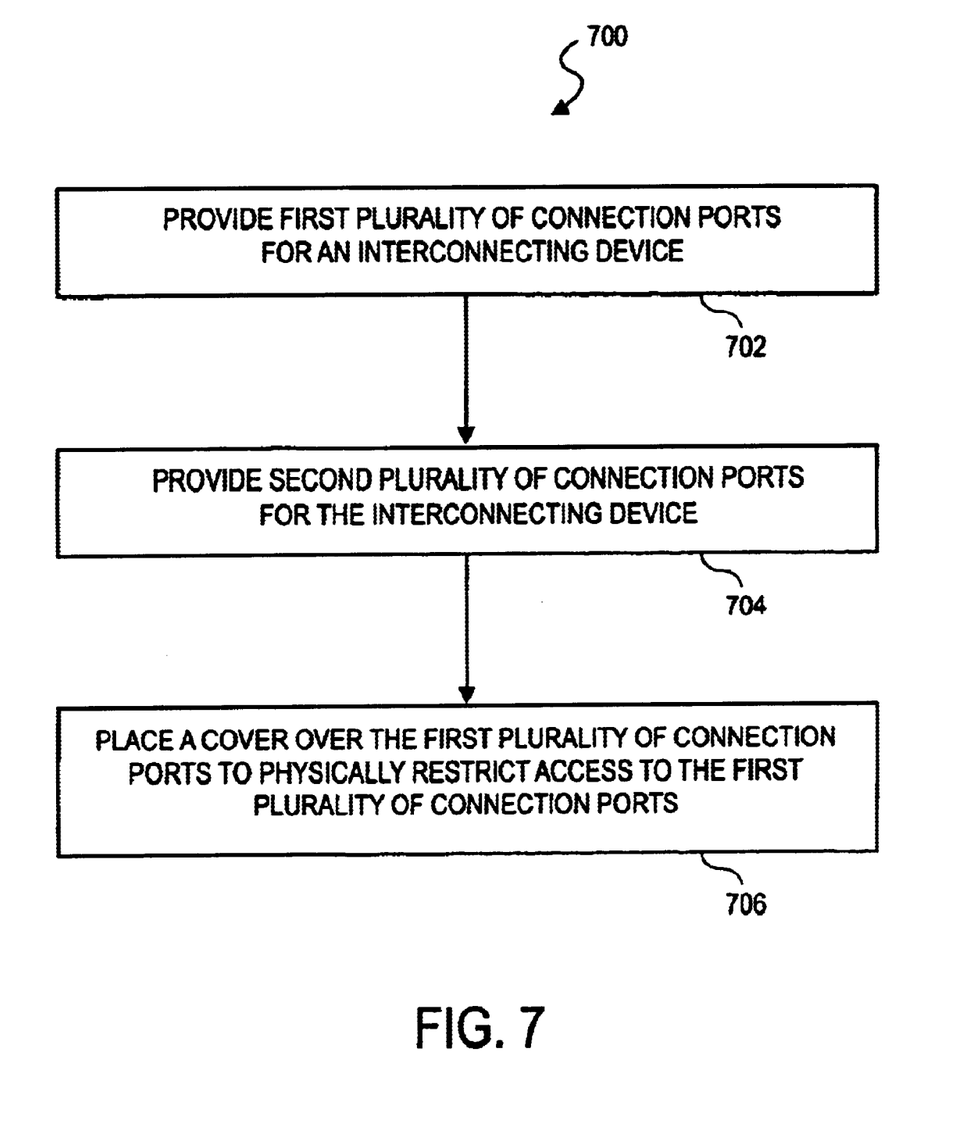
FIG. 7 illustrates an exemplary method of physically restricting access to an interconnecting device.

FIG. 7 illustrates an exemplary method 700 of restricting access to an interconnecting device that can be incorporated into a data processing system as previously described. At operation 702, the interconnecting device is configured or provided with a first plurality of connection ports as previously described. The number of first connection ports may be varied depending on needs and applications, and the first connection ports can be anywhere from one to more than one ports. The interconnecting device includes an adapter as previously described wherein the connectors on the adapter are coupled to the first connection ports. At operation 704, the interconnecting device is configured or provided with a second plurality of connection ports as previously described. The number of second connection ports may be varied depending on needs and applications, and the second connection ports can be anywhere from one to more than one ports. At operation 706, a cover is placed over the first plurality of connection ports to physically restrict access to the first plurality of connection ports as previously described.

Figure 8:
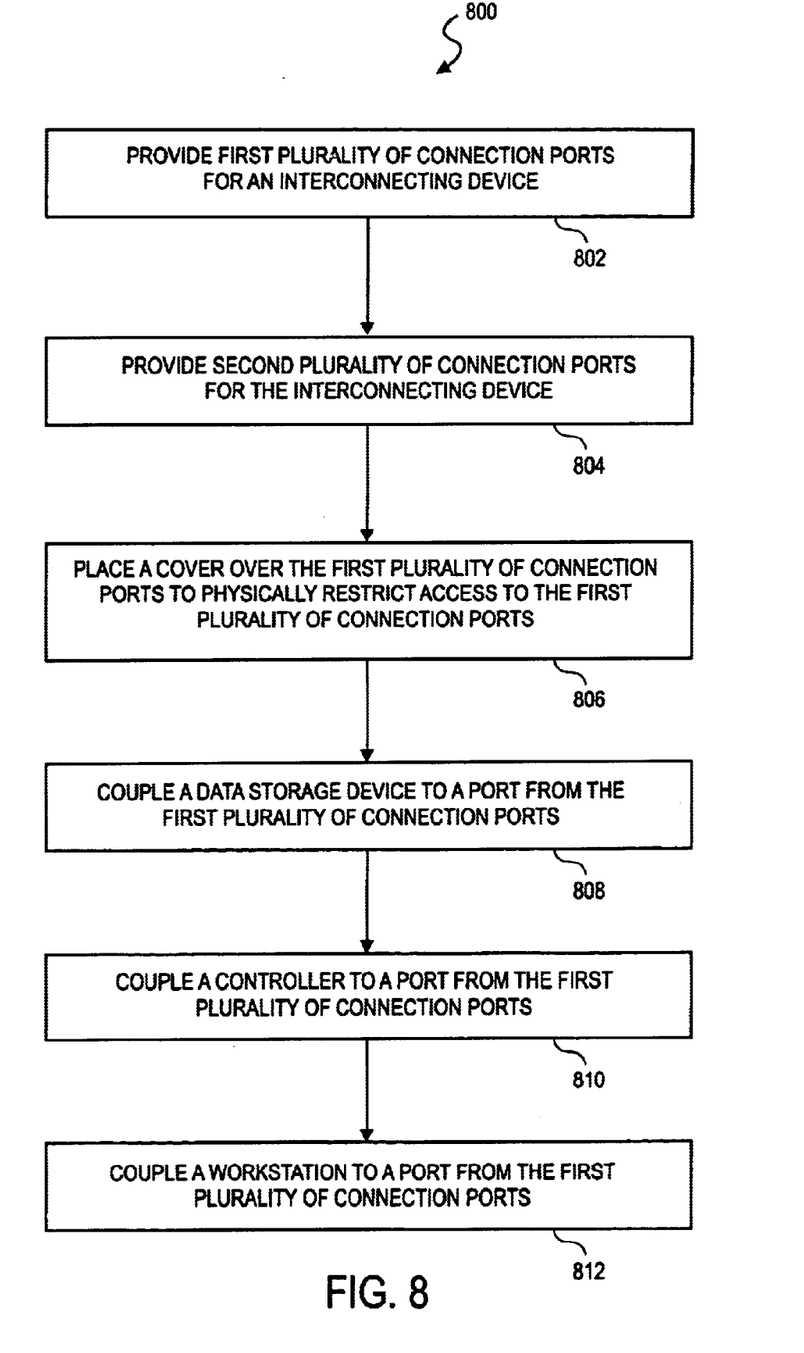
FIG. 8 illustrates an exemplary method of physically restricting access to an interconnecting device that is incorporated into a data storage network.

FIG. 8 illustrates an exemplary method 800 of restricting access to an interconnecting device that is incorporated into a storage network as previously described. At operation 802, the interconnecting device is configured or provided with a first plurality of connection ports as previously described. The number of first connection ports may be varied depending on needs and applications, and the first connection ports can be anywhere from one to more than one ports. The interconnecting device includes an adapter as previously described wherein the connectors on the adapter are coupled to the first connection ports. At operation 804, the interconnecting device is configured or provided with a second plurality of connection ports as previously described. The number of second connection ports may be varied depending on needs and applications, and the second connection ports can be anywhere from one to more than one ports. At operation 806, a cover is placed over the first plurality of connection ports to physically restrict access to the first plurality of connection ports as previously described. At operation 808, a data storage device as previously described is coupled to one of the receptacles on the adapter. At operation 810, a controller as previously described is coupled to one of the receptacles on the adapter. And, at operation 812, a workstation as previously described is coupled to one of the second plurality of connection ports. The numbers of the data storage device, the workstation, the interconnecting device, and the controller can be varied depending on the need of the data storage network.

While certain exemplary embodiments have been described and shown in the accompanying drawings, it is to be understood that such embodiments are merely illustrative and not restrictive of the current invention, and that this invention is not restricted to the specific constructions and arrangements shown and described since modifications may occur to those ordinarily skilled in the art.

We claim:

1. An interconnecting device for a data processing system comprising:

a first plurality of connection ports for connecting to first components of said data processing system;

a second plurality of connection ports for connecting to second components of said data processing system;

a cover placed over said first plurality of connection ports to restrict physical access to said first plurality of connection ports; and an adapter coupling to said first plurality of connection ports, said adapter comprising a backboard having a first end and a second end, a plurality of connectors having first conductive elements is coupled to said first end, a plurality of receptacles having second conductive elements is coupled to said second end, and a plurality of conductive lines coupling to said backboard, said plurality of conductive lines electrically connect said first conductive elements to said second conductive elements;

wherein said plurality of connectors is coupled to said first plurality of connection ports; and a housing whereupon said first plurality of connection ports and said second plurality of connection ports are located.

2. The adapter as in claim 1 wherein said plurality of connectors and said plurality of receptacles are placed on a top surface of said backboard and said plurality of conductive lines is placed on a bottom surface of said backboard.

3. The adapter as in claim 1 wherein said plurality of connectors and said plurality of receptacles form an angle of about 180-degree to each other.

4. The adapter as in claim 1 wherein said plurality of connectors and said plurality of receptacles form an angle of about 90-degree to each other.

5. The interconnecting device as in claim 1 wherein said interconnecting device is selected from a group consisting of a router, a switch router, a switch, and a hub.

6. The interconnecting device as in claim 1 wherein said data processing system is a data storage network.

7. The interconnecting device as in claim 1 wherein said first components comprise at least one of data storage devices, data storage servers, and data storage devices.

8. The interconnecting device as in claim 1 wherein said second components comprise at least one of workstations, host data processing systems, data storage devices, client data processing systems, and stand-alone computers.

9. The interconnecting device as in claim 1 further comprises a controller interconnected to one of said first plurality of connection ports, said controller manages data transfers at least one of within said data processing system, to said data processing system, and from said data processing system.

10. The interconnecting device as in claim 1 wherein said first plurality of connection ports and said second plurality of connection ports are located on one side of said interconnecting device.

11. The interconnecting device as in claim 1 wherein said first plurality of connection ports and said second plurality of connection ports are located on the side of said data processing system that faces an external environment of said data processing system.

12. The interconnecting device as in claim 1 wherein said data processing system is constrained in a housing wherein said second components are external components located externally to said housing and wherein said first components are internal components located within said housing.

13. A storage network comprising:

an interconnecting device having a first plurality of connection ports and a second plurality of connection ports, wherein a cover is placed over said first plurality of connection ports to restrict physical access to said first plurality of connection ports, said interconnecting device further comprising an adapter comprising a backboard having a first end and a second end, a plurality of connectors having first conductive elements is coupled to said first end, a plurality of receptacles having second conductive elements is coupled to said second end, and a plurality of conductive lines coupling to said backboard, said plurality of conductive lines electrically connect said first conductive elements to said second conductive elements, wherein the plurality of connectors connecting to the first plurality of connection ports;

at least one data storage device, said at least one data storage device coupled to one of said plurality of receptacles to connect to the interconnecting device; and wherein data are transferred between said at least one data storage device and at least one workstation via said interconnecting device, said at least one workstation being connectable to one of said second plurality of connection ports; and a housing whereupon said first plurality of connection ports and said second plurality of connection ports are located.

14. The storage network as in claim 13 wherein said interconnecting device is selected from a group consisting of a router, a switch router, a switch, and a hub.

15. The storage network as in claim 13 further comprising a controller interconnected to one of said plurality of receptacles, said controller manages data transfers at least one of within said storage network, to said storage network, and from said storage network.

16. The storage network as in claim 13 wherein said first plurality of connection ports and said second plurality of connection ports are located on one side of said interconnecting device.

17. The storage network as in claim 13 wherein said at least one data storage device and said interconnecting device are contained within a housing wherein said first plurality of connection ports and said second plurality of connection ports are located on one side of said interconnecting device, wherein only said second plurality of connection ports are exposed, and wherein said cover physically restrict access to said first plurality of connection ports.

18. A storage system comprising:

a switch having a first plurality of connection ports and a second plurality of connection ports, wherein a cover is affixed over said first plurality of connection ports to restrict physical access to said first plurality of connection ports, said switch further comprising an adapter comprising a backboard having a first end and a second end, a plurality of connectors having first conductive elements is coupled to said first end, a plurality of receptacles having second conductive elements is coupled to said second end, and a plurality of conductive lines coupling to said backboard, said plurality of conductive lines electrically connect said first conductive elements to said second conductive elements, and wherein the plurality of connectors connecting to the first plurality of connection ports;

a controller interconnected to one of said plurality receptacles to connect to the switch;

at least one data storage device, said at least data storage device interconnected to another of said first plurality of connection ports; and wherein said switch is configured to transfer data between said at least one data storage device and at least one workstation and wherein said controller is configured to manage at least one of storage of data and transfer of data within said storage system and wherein said at least one workstation is connectable to one of said second plurality of connection ports; and a housing whereupon said first plurality of connection ports and said second plurality of connection ports are located.

19. The connecting device as in claim 1 wherein said first components comprise at least one of data storage devices, data storage servers, data storage devices, data storage rack, a controller, a storage controller, and a central server.

20. The storage system as in claim 18 wherein said at least one data storage device said interconnecting device, and said controller are contained within a housing wherein said first plurality of connection ports and said second plurality of connection ports are located on one side of said interconnecting device, wherein only said second plurality of connection ports are exposed, and wherein said cover physically restricts access to said first plurality of connection ports.

21. A method of restricting access to an interconnecting device of a data processing system comprising:
providing a first plurality of connection ports on said interconnecting device, said interconnecting device comprising an adapter comprising a backboard having a first end and a second end, a plurality of connectors having first conductive elements is coupled to said first end, a plurality of receptacles having second conductive elements is coupled to said second end, and a plurality of conductive lines coupling to said backboard, said plurality of conductive lines electrically connect said first conductive elements to said second conductive elements wherein said plurality of connectors are coupled to said first plurality of connection ports;
coupling first components of said data processing system to said plurality of receptacles;
providing a second plurality of connection ports on said interconnecting device for coupling to second components of said data processing system; and
placing a cover over said first plurality of connection ports to physically restrict access to said first plurality of connection ports;
wherein said interconnecting device is configured to transfer data between said first components and said second components of said data processing system; and
providing a housing whereupon said first plurality of connection ports and said second plurality of connection ports are located.

22. The method of claim 21 wherein said first components comprise at least one of a controller and a data storage device.

23. The method of claim 21 wherein said second components comprise at least one of workstations, host data processing systems, client data processing systems, and stand-alone computers.

24. The method of claim 21 wherein said data processing system is constrained in a housing wherein said second components are external components located externally to said housing and wherein said first components are internal components located within said housing.

25. A method of restricting access to an interconnecting device of a storage network comprising:
providing an interconnecting device having a first plurality of connection ports, a second plurality of connection ports, and an adapter which comprises a backboard having a first end and a second end, a plurality of connectors having first conductive elements is coupled to said first end, a plurality of receptacles having second conductive elements is coupled to said second end, and a plurality of conductive lines coupling to said backboard, said plurality of conductive lines electrically connect said first conductive elements to said second conductive elements wherein said plurality of connectors are coupled to said first plurality of connection ports;
placing a cover over said first plurality of connection ports to physically restrict access to said first plurality of connection ports;
coupling at least one data storage device to one of said plurality of receptacles; and
wherein data are transferred between said at least one data storage device and at least one workstation via said interconnecting device, said at least one workstation being connectable to one of said second plurality of connection ports; and
providing a housing whereupon said first plurality of connection ports and said second plurality of connection ports are located.

26. The method of claim 25 further comprising:
coupling a controller to said another of said plurality of receptacles wherein said controller is configured to manage data transfer between said at least one data storage device and said at least one workstation.

27. An interconnecting device for a data processing system comprising:
a first connection port for connecting to a first component of said data processing system;
a second connection port for connecting to a second component of said data processing system;
an adapter comprising a backboard having a first end and a second end, a connector having first conductive elements is coupled to said first end, a receptacle having second conductive elements is coupled to said second end, and a plurality of conductive lines coupling to said backboard, said plurality of conductive lines electrically connect said first conductive elements to said second conductive elements wherein said connector is coupled to said first connection ports; and
a cover placed over said first connection port to physically restrict access to said first connection port; and
a housing whereupon said first plurality of connection ports and said second plurality of connection ports are located.

28. A storage network comprising:
an interconnecting device having a first connection port and a second connection port, wherein a cover is placed over said first connection port to restrict access to said first connection port, said interconnecting device further comprising an adapter comprising a backboard having a first end and a second end, a connector having first conductive elements is coupled to said first end, a receptacle having second conductive elements is coupled to said second end, and a plurality of conductive lines coupling to said backboard, said plurality of conductive lines electrically connect said first conductive elements to said second conductive elements wherein said connector is coupled to said first connection ports;
at least one data storage device, said at least data storage device coupled to said receptacle; and
wherein data are transferred between said at least one data storage device and said at least one workstation via said interconnecting device, said at least one workstation being connectable coupled to said second connection port; and
a housing whereupon said first plurality of connection ports and said second plurality of connection ports are located.

* * * * *